US012584208B2

(12) United States Patent (10) Patent No.: US 12,584,208 B2
Chaleix et al. (45) Date of Patent: *Mar. 24, 2026

(54) COATED METALLIC SUBSTRATE

(71) Applicant: ARCELORMITTAL, Luxembourg (LU)

(72) Inventors: Daniel Chaleix, Verny (FR); Christian Allely, Metz (FR); Eric Silberberg, Haltinne (BE); Sergio Pace, Jodoigne (BE); Lucie Gaouyat, Angleur (BE)

(73) Assignee: ArcelorMittal, Luxembourg (LU)

( * ) Notice: Subject to any disclaimer, the term of this patent is extended or adjusted under 35 U.S.C. 154(b) by 1696 days.

This patent is subject to a terminal disclaimer.

(21) Appl. No.: 16/642,471

(22) PCT Filed: Jul. 20, 2018

(86) PCT No.: PCT/IB2018/055408
§ 371 (c)(1),
(2) Date: Feb. 27, 2020

(87) PCT Pub. No.: WO2019/043473
PCT Pub. Date: Mar. 7, 2019

(65) Prior Publication Data
US 2020/0263289 A1 Aug. 20, 2020

(30) Foreign Application Priority Data
Aug. 30, 2017 (WO) .................. PCT/IB2017/001048

(51) Int. Cl.
| | |
|---|---|
| *C23C 14/16* | (2006.01) |
| *B32B 15/01* | (2006.01) |
| *B32B 15/04* | (2006.01) |
| *B32B 15/18* | (2006.01) |
| *C23C 2/02* | (2006.01) |
(Continued)

(52) U.S. Cl.
CPC .......... *C23C 14/165* (2013.01); *B32B 15/012* (2013.01); *B32B 15/013* (2013.01); *B32B 15/017* (2013.01); *B32B 15/04* (2013.01); *B32B 15/043* (2013.01); *B32B 15/18* (2013.01); *C23C 2/024* (2022.08); *C23C 2/026* (2022.08); *C23C 2/04* (2013.01); *C23C 2/06* (2013.01); *C23C 2/12* (2013.01); *C23C 2/34* (2013.01); *C23C 2/40* (2013.01); *C23C 14/025* (2013.01); *C23C 14/16* (2013.01); *C23C 14/26* (2013.01); *C23C 14/30* (2013.01); *C23C 14/3414* (2013.01); *C23C 14/35* (2013.01); *C23C 14/56* (2013.01); *C23C 28/02* (2013.01); *C23C 28/021* (2013.01); *C23C 28/023* (2013.01); *C23C 28/025* (2013.01); *C23C 30/00* (2013.01); *C23C 30/005* (2013.01); *Y10T 428/12493* (2015.01); *Y10T 428/12729* (2015.01); *Y10T 428/12736* (2015.01); *Y10T 428/12757* (2015.01); *Y10T 428/12799*

(2015.01); *Y10T 428/12854* (2015.01); *Y10T 428/12944* (2015.01); *Y10T 428/12951* (2015.01); *Y10T 428/12972* (2015.01); *Y10T 428/12979* (2015.01); *Y10T 428/2495* (2015.01); *Y10T 428/24959* (2015.01); *Y10T 428/24967* (2015.01);
(Continued)

(58) Field of Classification Search
CPC ..... C23C 14/165; C23C 14/025; C23C 14/16; C23C 14/26; C23C 14/30; C23C 14/3414; C23C 14/35; C23C 14/56; C23C 2/02; C23C 2/024; C23C 2/026; C23C 2/06; C23C 2/04; C23C 2/12; C23C 2/34; C23C 2/40; C23C 28/02; C23C 28/021; C23C 28/023; C23C 28/025; C23C 30/00; C23C 30/005; Y10T 428/12493; Y10T 428/12736; Y10T 428/12757; Y10T 428/12799; Y10T 428/12854; Y10T 428/12944; Y10T 428/12951; Y10T 428/12972; Y10T 428/12979; Y10T 428/12729; Y10T 428/2495; Y10T 428/24959; Y10T 428/24975; Y10T 428/24967; Y10T 428/265; Y10T 428/26; B32B 15/012; B32B 15/013; B32B 15/017; B32B 15/04; B32B 15/043; B32B 15/18
See application file for complete search history.

(56) References Cited

U.S. PATENT DOCUMENTS

| | | | |
|---|---|---|---|
| 3,898,052 | A | 8/1975 | Dean et al. |
| 5,447,748 | A | 9/1995 | Kiaori et al. |
(Continued)

FOREIGN PATENT DOCUMENTS

| | | |
|---|---|---|
| CN | 107109666 A1 | 8/2017 |
| EP | 1972699 A1 | 9/2008 |
(Continued)

OTHER PUBLICATIONS

ASTM Designation E29-13, "Standard Practice for Using Significant Digits in Test Data to Determine Conformance with Specifications," Dec. 2014 (five pages) (Year: 2014).*
(Continued)

*Primary Examiner* — Michael E. La Villa
(74) *Attorney, Agent, or Firm* — Davidson Kappel LLC

(57) ABSTRACT

A coated metallic substrate including at least a first coating consisting of aluminum is provided. The first coating has a thickness between 1.0 and 4.5 μm and is directly topped by a second coating based on zinc, such second coating having a thickness between 1.5 and 9.0 μm. The thickness ratio of the first coating with respect to the second coating is between 0.2 and 1.2.

19 Claims, 2 Drawing Sheets

(51) Int. Cl.

| | |
|---|---|
| *C23C 2/04* | (2006.01) |
| *C23C 2/06* | (2006.01) |
| *C23C 2/12* | (2006.01) |
| *C23C 2/34* | (2006.01) |
| *C23C 2/40* | (2006.01) |
| *C23C 14/02* | (2006.01) |
| *C23C 14/26* | (2006.01) |
| *C23C 14/30* | (2006.01) |
| *C23C 14/34* | (2006.01) |
| *C23C 14/35* | (2006.01) |
| *C23C 14/56* | (2006.01) |
| *C23C 28/02* | (2006.01) |
| *C23C 30/00* | (2006.01) |

(52) U.S. Cl.
CPC ...... *Y10T 428/24975* (2015.01); *Y10T 428/26* (2015.01); *Y10T 428/265* (2015.01)

(56) References Cited

U.S. PATENT DOCUMENTS

| | | | |
|---|---|---|---|
| 9,670,576 B2 | 6/2017 | Monnoyer et al. | |
| 11,668,002 B2 * | 6/2023 | Chaleix ................... | C23C 14/30 |
| | | | 427/250 |
| 2002/0192494 A1 * | 12/2002 | Tzatzov ................... | C23C 26/00 |
| | | | 428/656 |
| 2006/0177596 A1 | 8/2006 | De Meyer et al. | |
| 2012/0085466 A1 | 4/2012 | Lupp et al. | |
| 2015/0013409 A1 | 1/2015 | Monnoyer et al. | |
| 2015/0352812 A1 | 12/2015 | Jung et al. | |
| 2016/0017452 A1 | 1/2016 | Puerta Velasquez et al. | |
| 2017/0350029 A1 | 12/2017 | Hong et al. | |
| 2018/0044774 A1 | 2/2018 | Allely et al. | |
| 2018/0112305 A1 | 4/2018 | Choquet et al. | |
| 2020/0199762 A1 | 6/2020 | Chaleix et al. | |
| 2020/0263289 A1 | 8/2020 | Chaleix et al. | |

FOREIGN PATENT DOCUMENTS

| | | | | | |
|---|---|---|---|---|---|
| GB | 1187802 | A | 4/1970 | | |
| JP | H02159366 | A | 6/1990 | | |
| JP | H0324255 | A | 2/1991 | | |
| JP | 2017512909 | A | 12/2014 | | |
| KR | 100775241 | B1 | 11/2007 | | |
| RU | 2535424 | C1 | 12/2014 | | |
| UA | 105879 | C2 | 6/2014 | | |
| WO | WO2014037627 | A1 | 3/2014 | | |
| WO | WO-2015150850 | A1 * | 10/2015 | ............ | B32B 15/00 |
| WO | 2016132165 | A1 | 8/2016 | | |
| WO | WO-2016132194 | A1 * | 8/2016 | ............ | B21D 53/88 |
| WO | WO-2018220411 | A1 * | 12/2018 | ............ | B32B 15/00 |
| WO | 2019043472 | A | 3/2019 | | |
| WO | WO2019043473 | A1 | 3/2019 | | |

OTHER PUBLICATIONS

See International Search Report of PCT/IB2018/054408, dated Sep. 10, 2018.

Niu et al:"Microstructure Evolution and Corrosion Behavios of Degradable Zn—7Mg Alloy After Heat Treatment," vol. 37, No. 4, Aug. 2017, 379-353, see partial machine translation 吕炎等编著："《 塑性成形件质量控制理论与技术 》", May 31, 2013.

"Quality Control Theory and Technology of Plastic Forming Parts," May 31, 2013, see partial machine translation 牛振国等："Zn—7Mg 合金热处理显微组织演变及耐蚀性能研究 "，《中国腐蚀与防护学报》.

"Modern Continuous Hot Dip Galvanizing of Steel Strips," Jan. 31, 2007, see partial machine translation 张启富, 刘邦津, 黄建中编著："《 现代钢带连续热镀锌 》", Jan. 31, 2007.

* cited by examiner

COATED METALLIC SUBSTRATE

The present invention relates to a coated metallic substrate and a method for the manufacture of this coated metallic substrate. The invention is particularly well suited for automotive industry.

BACKGROUND

With a view of saving the weight of vehicles, it is known to reduce the thickness of steel sheet or steel panels by adding metallic coatings having properties such that a good resistance to corrosion, a good phosphability, etc. Additionally, a low thickness allows for a better weldability.

Zinc based coatings are generally used because they allows for a protection against corrosion thanks to barrier protection and cathodic protection. The barrier effect is obtained by the application of a metallic coating on steel surface. Thus, the metallic coating prevents the contact between steel and corrosive atmosphere. On the other hand, sacrificial cathodic protection is based on the fact that zinc is a metal less noble that steel. Thus, if corrosion occurs, zinc is consumed preferentially to steel. Cathodic protection is essential in areas where steel is directly exposed to corrosive atmosphere, like cut edges where surrounding zinc will be consumed before steel. Although zinc coating has a sacrificial protection, the barrier effect is not enough sufficient and therefore the protection against corrosion is not high enough.

SUMMARY OF THE INVENTION

Moreover, when heating steps are performed on such zinc coated steel sheets, for example press hardening or welding, cracks are observed in steel which spread from the coating. Indeed, occasionally, there is a reduction of metal mechanical properties due to the presence of cracks in coated steel sheet after heating steps. These cracks appear with the following conditions: high temperature; contact with a liquid metal having a low melting point (such as zinc) in addition to stress; heterogeneous diffusion of molten metal with substrate grain bulk and boundary. The designation for such phenomenon is liquid metal embrittlement (LME), also called liquid metal assisted cracking (LMAC).

Thus, there is a need to provide a well-protected coated metallic substrate having the lowest thickness possible, a low thickness allowing better weldability. Consequently, an object of the invention is to provide a thinnest coated metallic substrate having a reinforced protection against corrosion, i.e. a sacrificial cathodic protection in addition to barrier protection, and which does not have LME issues. It aims to make available, in particular, an easy to implement method in order to obtain such coated metallic substrate.

In terms of sacrificial protective corrosion, electrochemical potential has to be at least 50 mV more negative than the potential of the metallic substrate. For example, in case of steel substrate, a maximum potential of −0.78V with respect to a saturated calomel electrode (SCE) is needed. It is preferable not to decrease the potential at a value of −1.4V/SCE, even −1.25V/SCE which would involve a fast consumption and would finally decrease the period of protection of steel.

The present invention provides a coated metallic substrate comprising at least a first coating consisting of aluminum, such first coating having a thickness between 1.0 and 4.5 μm and being directly topped by a second coating based on zinc, such second coating having a thickness between 1.5 and 9.0

μm and wherein the thickness ratio of the first coating with respect to the second coating is between 0.2 and 1.2.

The present invention also provides a method for the manufacture of the coated steel substrate comprising the following steps: provision of a steel substrate, optionally, a surface preparation step of the steel substrate, deposition of the first coating consisting of aluminum, such first coating having a thickness between 1.0 and 4.5 μm and deposition of the second coating based on zinc, such second coating having a thickness between 1.5 and 9.0 μm and wherein the thickness ratio of the first coating with respect to the second coating is between 0.2 and 1.2.

The present invention also provides a method for manufacturing an automotive vehicle part comprising: manufacturing the automotive vehicle part using the coated steel substrate.

The present invention also provides an installation for continuous vacuum deposition of coatings on a running steel substrate using the method to obtain the coated steel substrate comprising in the following order: optionally, an intermediate section comprising a magnetron cathode pulverization device, a first section comprising an electron beam evaporation device and a second section comprising a jet vapor evaporation device.

Other characteristics and advantages of the invention will become apparent from the following detailed description of the invention.

BRIEF DESCRIPTION OF THE DRAWINGS

To illustrate the invention, various embodiments and trials of non-limiting examples will be described, particularly with reference to the following Figures.

DETAILED DESCRIPTION

Figure 1:
FIG. 1 is an illustration of the specimen used for the LME test.

In all the figures, the thickness of the layers represented is exclusively for purposes of illustration and cannot be considered to be a representation of the different layers to scale.

The following terms will be defined:

"wt. %" means the percentage by weight.

The inventions relates to a coated metallic substrate comprising at least a first coating consisting of aluminum, such first coating having a thickness between 1.0 and 4.5 μm and being directly topped by a second coating based on zinc, such second coating having a thickness between 1.5 and 9.0 μm and wherein the thickness ratio of the first coating with respect to the second coating is between 0.2 and 1.2. The first coating consists of aluminum, i.e. the amount of aluminum in the first coating is above 99.0% by weight.

Without willing bound by any theory, it is believed that the above coated metallic substrate has a high protection against corrosion with the thinnest thickness possible. Indeed, it seems that the combination of the first and second coatings having the above specific thicknesses and thickness ratio allows for a high barrier effect and a high sacrificial protection.

It seems that the first coating consisting of aluminum have a thickness between 1.0 and 4.5 μm allowing a high corrosion resistance, in particular a high barrier effect. The second coating based on zinc have a thickness between 3.0 and 9.0 μm allowing a high corrosion resistance, in particular a high sacrificial protection. Moreover, it was found that to obtain the thinnest coated metallic substrate having a high corrosion resistance, the thickness ratio of the first coating with respect to the second coating has to be between 0.2 and 1.2. It is believed that if the thickness ratio is below 0.2, there is a risk that the corrosion resistance is not enough. If the thickness ratio is above 1.2, there is a risk not to obtain the thinnest thickness of the coated metallic substrate having the highest barrier effect, the highest sacrificial protection and a good weldability behavior.

Finally, the coated metallic substrate having the first and second layers has a high resistance to LME mainly due to the presence of aluminum in the above specific thickness. Consequently, with the specific coated metallic substrate according to the present invention, it is possible to obtain the thinnest coated metallic substrate having a high barrier effect, i.e. a high sacrificial protection and a high barrier effect, in addition to the resistance to LME.

Preferably, the second coating comprises less than 0.5% by weight of magnesium.

Advantageously, the second coating comprises at least one element chosen among: Si and Mg.

In another preferred embodiment, the second coating does not comprise at least one of the following elements: magnesium, aluminum, copper and silicon. Indeed, without willing to be bound by any theory, it seems that the presence of magnesium in the second coating could allow for surface defect due to the formation of Magnesium oxide, the presence of aluminum could reduce the sacrificial protection and the presence of silicon could reduce the sacrificial protection.

Advantageously, the second coating consists of zinc, i.e. the amount of zinc in the first coating is above 99.0% by weight.

Preferably, the first coating has a thickness between 2 and 4 μm.

Advantageously, the second coating has a thickness between 1.5 and 8.5 μm. For example, the second coating has a thickness between 1.5 and 4.5 μm or between 4.5 μm and 8.5 μm.

Preferably, the ratio of the first coating with respect to the second coating is between 0.2 and 0.8 and more preferably, between 0.3 and 0.7.

Preferably, an intermediate layer is present between the metallic substrate and the first coating, such intermediate layer comprising iron, nickel, chromium and optionally titanium. Without willing to be bound by any theory, it seems that the intermediate coating layer further improves the adhesion of the first coating on a metallic substrate.

In a preferred embodiment, the intermediate layer comprises at least 8% by weight nickel and at least 10% by weight chromium, the rest being iron. For example, the layer of metal coating is 316 stainless steel including 16-18% by weight Cr and 10-14% by weight Ni, the balance being Fe.

In another preferred embodiment, the intermediate layer comprises Fe, Ni, Cr and Ti wherein the amount of Ti is above or equal to 5 wt. % and wherein the following equation is satisfied: 8 wt. %<Cr+Ti<40 wt. %, the balance being Fe and Ni, such intermediate coating layer being directly topped by a coating layer being an anticorrosion metallic coating.

The metallic substrate can be chosen among: aluminum substrate, steel substrate, stainless steel substrate, copper substrate, iron substrate, copper alloys substrate, titanium substrate, cobalt substrate or nickel substrate.

The present invention also relates to a method for the manufacture of a coated metallic substrate according to the present invention comprising the following step:

A. The provision of a metallic substrate,

B. Optionally, a surface preparation step of the metallic substrate,

C. the deposition of the first coating consisting of aluminum, such first coating having a thickness between 1.0 and 4.5 μm and D. The deposition of the second coating based on zinc, such second coating having a thickness between 1.5 and 9.0 μm and wherein the thickness ratio of the first coating with respect to the second coating is between 0.2 and 1.2.

Preferably, in when step B) is performed, the surface treatment is chosen from: shot blasting, pickling, etching, polishing, sand blasting, grinding and the deposition of an intermediate layer comprising iron, nickel, chromium and optionally titanium. Preferably, the surface treatment consists in depositing an intermediate layer on the metallic substrate. Moreover, the intermediate layer permits to avoid the removal of the oxide layer naturally present on the metallic substrate.

Preferably, In steps C) and D), the deposition of the first and second coatings independently of one another are performed by a hot-dip coating, by electrodeposition process or by vacuum deposition. For example, the first coating is deposited by hot-dip and the second coating by vacuum deposition. In another example, the first and seconds coatings are deposited by vacuum deposition.

In steps C) and D), when vacuum deposition is performed, the first and second coatings independently of one another are deposited by magnetron cathode pulverization process, jet vapor deposition process, electromagnetic levitation evaporation process or electron beam physical vapor deposition. For example, the first coating is deposited by magnetron cathode pulverization process and the second coating is deposited by jet vapor deposition process.

The present invention also relates to the use of the coated metallic substrate according to the present invention for the manufacture of a part of an automotive vehicle.

Figure 2:
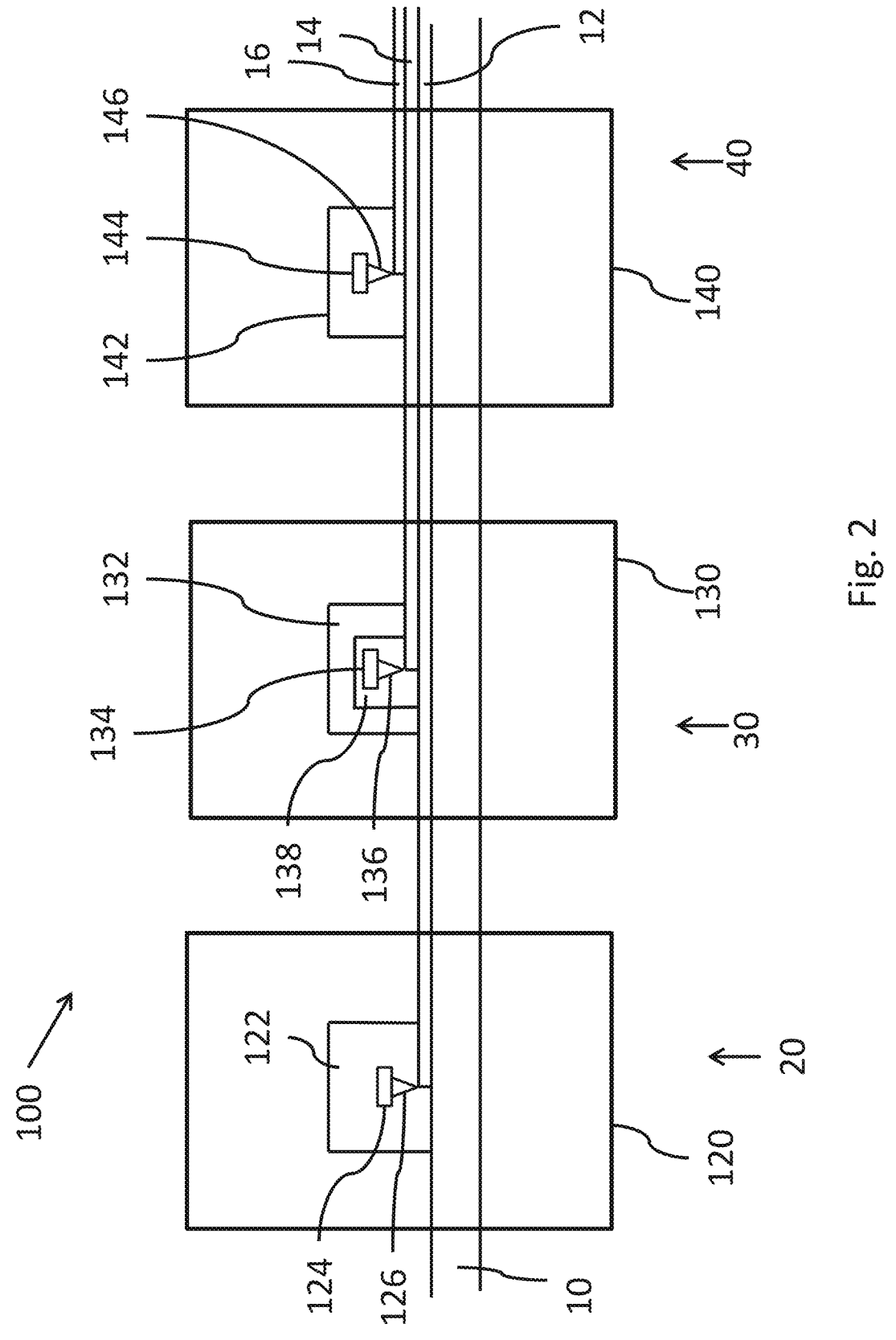
FIG. 2 shows schematically an embodiment of the installation to obtain an embodiment of the coated steel substrate.

Finally, the present invention relates to an installation 100 shown schematically in FIG. 2 for continuous vacuum deposition of coatings on a running metallic substrate 10 using the method according to the present invention for the manufacture of a coated metallic substrate according to the present invention comprising in the following order:

A. Optionally, an intermediate section 20 comprising a magnetron cathode pulverization device 120, B. A first section 30 comprising an electron beam evaporation device 130 and C. A second section 40 comprising a jet vapor evaporation device 140.

Preferably, when the intermediate section 20 is present, the magnetron cathode pulverization device 120 comprises a vacuum deposition chamber 122 comprising one target 124 made of iron, chromium, nickel and optionally titanium and a plasma source 126 to deposit an intermediate layer 12 comprising iron, nickel, chromium and optionally titanium on the metallic substrate.

In this case, inert gas is injected into the vacuum deposition chamber being at a pressure between $10^{-5}$ and $10^{-9}$ mbar. The plasma source creates a plasma which electrically charges the gas. Surface atoms of the target are physically ejected by the bombardment of energetic particles (ions) created in a plasma. Ejected atoms deposit on the metallic substrate.

Preferably, in the first section, the electron beam evaporation device 130 comprises a vacuum deposition chamber 132 comprising an evaporation crucible 134 comprising metal consisting of aluminum, a heating device 138 and an electron gun 136 to deposit the first coating 14 having a thickness between 1.0 and 4.5 μm.

Preferably, in the second section 140, the jet vapor evaporation device 40 comprises a vacuum deposition chamber 142 comprising a vapor jet coater 146 and at least one evaporation crucible 144 suited to feed the vapor jet coater with a vapor based on zinc.

Preferably, the vapor jet coater is a sonic vapor jet coater and the evaporation crucible comprises an induction heater.

Advantageously, a recharging furnace is placed beneath the evaporation crucible and is adapted to be maintained at atmospheric pressure. More preferably, the recharging furnace is connected to a metal ingot feed means.

In the vacuum deposition chamber, beside the face of the metallic substrate which has to be coated, there is a vapor jet coater. This coater is suited to spray a metal alloy vapor based on zinc onto the running substrate.

The vapor jet coater is mounted on an evaporation crucible suited to feed the vapor jet coater with a vapor based on zinc. In a preferred embodiment, one evaporation crucible is suited to contain a metal bath comprising zinc generating the vapor to be deposited on the substrate. In another preferred embodiment, two evaporation crucibles are used, one evaporator crucible containing another metal and one evaporator crucible containing zinc, the mixture of both metals vapors is deposited on the substrate. Preferably, the at least evaporation credible is preferably located in the deposition chamber.

The evaporation crucible can be provided with heating means enabling the metal alloy vapor to form and to feed the vapor jet coater. The evaporation crucible is advantageously provided with an induction heater which has the advantage of making the stirring and the composition homogenization of the metal alloy bath easier.

The pressure in the evaporation crucible depends on the bath temperature and on the metal bath composition. It generally varies between $10^{-3}$ and $10^{-1}$ bar. Accordingly, the pressure in the deposition chamber 2 is kept above the one in the evaporation crucible.

The at least evaporation crucible can be connected to a recharging furnace suited to feed the evaporation crucible with zinc and/or another metal. The recharging furnace is preferably located outside of the vacuum deposition chamber. The recharging furnace is preferably placed beneath the evaporation crucible and adapted to be maintained at atmospheric pressure. Due to the height between the evaporation crucible and the recharging furnace and to the pressure difference created between them, the molten main element goes up in the evaporation crucible by barometric effect as the metal bath evaporates. This ensures a continuous feeding of the evaporation crucible and contributes to maintaining a constant level of liquid in the evaporation crucible, whatever the line speed.

The invention will now be explained in trials carried out for information only. They are not limiting.

EXAMPLES

For all samples, the composition of the steel sheet used is as follows: 0.2% by weight of C, 1.5% by weight of Si, 2% by weight of Mn, 0.04% by weight of Al, the balance being iron.

For Trial 1, a coating of Zn was deposited by electrodeposition on a steel sheet.

For Trials 2 to 4, an intermediate layer being 316 stainless steel including 16-18% by weight Cr and 10-14% by weight Ni, the balance being Fe was deposited by magnetron cathode pulverization, a first coating of aluminum was deposited by electron beam deposition and a second coating of zinc was deposited by JVD.

For Trial 5, no coating was deposited on the steel sheet.

Example 1: LME Test

In order to measure LME sensitivity, high temperature tensile test was performed in conditions as close as possible to spot welding conditions.

Tensile specimens are illustrated in FIG. 1. Two holes in the heads are machined to inserts pins and thus ensuring no sliding during the test.

Then, a preload force of 1 kN is applied on each specimen. The specimens are heated at a heating rate about 1000° C./s to reach a temperature between 750 and 950° C. When the temperature is reached, displacement is applied to specimens until a full failure. A strain rate of 3 mm/s was used during the test.

Stress-strain curves are determined and analyzed. The derived of this stress-strain curve is calculated and drawn. Steel elongation when the strain derivative is minimum, corresponds to the fracture of the specimen. If this fracture results from an LME phenomenon, i.e. if liquid zinc is present in cracks, this elongation is defined as the "critical LME elongation value". If this fracture is a ductile fracture, the elongation is defined as "critical elongation value". This value then plotted as a function of the temperature of the tensile test.

Results are shown in the following Table 1. 0 means excellent, in other words, there is no liquid zinc in cracks, i.e. the fracture is ductile; 1 means bad, in other words, liquid zinc is present in cracks corresponding to LME cracks.

| Trials | Coating | | | | | Temperature (° C.) | Critical LME elongation or Critical elongation value (mm) | LME cracks |
|---|---|---|---|---|---|---|---|---|
| | 1ˢᵗ coating | Thickness (μm) | 2ⁿᵈ coating | Thickness (μm) | Thickness ratio | | | |
| 1 | Zn (EG) | 7.5 | — | — | — | 750 | 0.6 | 1 |
| | | | | | | 800 | 0.7 | 1 |
| | | | | | | 850 | 1.2 | 1 |
| | | | | | | 900 | 0.9 | 1 |
| | | | | | | 950 | 0.6 | 1 |
| 2* | Al | 2 | Zn | 2 | 1 | 750 | 3.2 | 0 |
| | | | | | | 800 | 3.5 | 0 |

-continued

| Trials | Coating 1$^{st}$ coating | Thickness (μm) | 2$^{nd}$ coating | Thickness (μm) | Thickness ratio | Temperature (° C.) | Critical LME elongation or Critical elongation value (mm) | LME cracks |
|---|---|---|---|---|---|---|---|---|
| | | | | | | 850 | 3 | 0 |
| | | | | | | 900 | 2.3 | 0 |
| | | | | | | 950 | 3 | 0 |
| 3* | Al | 3 | Zn | 5 | 0.6 | 750 | 3.9 | 0 |
| | | | | | | 800 | 3.8 | 0 |
| | | | | | | 850 | 3.2 | 0 |
| | | | | | | 900 | 3.2 | 0 |
| | | | | | | 950 | 3.6 | 0 |
| 4* | Al | 3 | Zn | 7.5 | 0.4 | 750 | 4 | 0 |
| | | | | | | 800 | 4 | 0 |
| | | | | | | 850 | 3.2 | 0 |
| | | | | | | 900 | 3.2 | 0 |
| | | | | | | 950 | 3.2 | 0 |
| 5 | — | — | — | — | — | 750 | 3.2 | 0 |
| | | | | | | 800 | 3.8 | 0 |
| | | | | | | 850 | 3.2 | 0 |
| | | | | | | 900 | 2.9 | 0 |
| | | | | | | 950 | 3.1 | 0 |

*according to the present invention.

Trials 2 to 4 according to the present invention show excellent resistant to LME at the same level as the bare steel, i.e. Trial 5.

Example 2: Electrochemical Behavior Test

Trials 1, 3 and 4 were prepared and subjected to an electrochemical potential test.

A test consisting in measuring the electrochemical potential of the coated steel surface sheet was realized. Steel sheets and coatings were separated and dipped in a solution comprising 5% by weight of sodium chloride at pH 7. A saturated calomel electrode (SCE) was also immersed into the solution. The coupling potential of the surface was measured over time. Results are shown in the following Table 2:

| Trials | Coating 1$^{st}$ coating | Thickness (μm) | 2$^{nd}$ coating | Thickness (μm) | Thickness ratio | Electro-chemical potential (V/SCE) |
|---|---|---|---|---|---|---|
| 1 | Zn (EG) | 7.5 | — | — | — | −0.8 |
| 3* | Al | 3 | Zn | 5 | 0.6 | −0.9 |
| 4* | Al | 3 | Zn | 7.5 | 0.4 | −0.9 |

*according to the present invention.

Trials 3 and 4 according to the present invention have a higher sacrificial protection compared to Trial 1. Coupling potential of Trial 3 and 4 is under −0.78V/SCE as required, i.e. the minimum electrochemical potential for having sacrificial protection against corrosion.

What is claimed is:

1. A coated steel substrate comprising:
a steel substrate; and
a first coating on the steel substrate, the first coating consisting of aluminum and having a thickness between 1.0 and 4.5 μm and being directly topped by a second coating based on zinc, the second coating having a thickness between 1.5 and 9.0 μm, a thickness ratio of the first coating with respect to the second coating being between 0.2 and 1.2.

2. The coated steel substrate as recited in claim 1 wherein the second coating includes at least one element selected from the group consisting of Si and Mg.

3. The coated steel substrate as recited in claim 1 wherein the second coating includes less than 0.5% by weight of magnesium.

4. The coated steel substrate as recited in claim 1 wherein the second coating does not comprise at least one of the following elements: magnesium, aluminum, copper and silicon.

5. The coated steel substrate as recited in claim 1 wherein the second coating consists of zinc.

6. The coated steel substrate as recited in claim 1 wherein the first coating has a thickness between 2.0 and 4.0 μm.

7. The coated steel substrate as recited in claim 1 wherein the second coating has a thickness between 1.5 and 8.5 μm.

8. The coated steel substrate as recited in claim 1 wherein the thickness ratio of the first coating with respect to the second coating is between 0.2 and 0.8.

9. The coated steel substrate as recited in claim 1 further comprising an intermediate layer between the steel substrate and the first coating, the intermediate layer including iron, nickel and chromium.

10. The coated steel substrate as recited in claim 9 wherein the intermediate layer includes titanium.

11. The coated steel substrate as recited in claim 1 wherein the second coating forms a top surface of the coated steel substrate.

12. The coated steel substrate as recited in claim 1 wherein a top surface of the coated steel substrate consists of zinc and optionally magnesium and/or silicon.

13. The coated steel substrate as recited in claim 1 wherein the first coating has a thickness between 2.0 and 3.0 μm, and wherein the second coating has a thickness between 2.0 and 7.5 μm.

14. A method for the manufacture of the coated steel substrate as recited in claim 1 comprising the following steps:
providing a steel substrate;
depositing the first coating consisting of aluminum at the thickness of between 1.0 and 4.5 μm; and depositing the second coating based on zinc at the thickness of between 1.5 and 9.0 μm to achieve the thickness ratio of the first coating with respect to the second coating of between 0.2 and 1.2.

15. The method as recited in claim 14 further comprising preparing a surface of the steel substrate after the providing step and before the depositing of the first coating.

16. The method as recited in claim 15 wherein the surface is prepared by at least one of the following: shot blasting, pickling, etching, polishing, sand blasting, grinding and depositing of an intermediate layer comprising iron, nickel, chromium and optionally titanium.

17. The method as recited in claim 14 wherein the depositing of the first and second coatings are performed independently from each other by hot-dip coating, by electrodeposition process or by vacuum deposition.

18. The method as recited in claim 17 wherein the depositing of the first and second coatings occurs by vacuum deposition, and the first and second coatings independently from each other are deposited by magnetron cathode pulverization process, jet vapor deposition process, electromagnetic levitation evaporation process or electron beam physical vapor deposition.

19. A method for manufacturing an automotive vehicle part comprising: manufacturing the automotive vehicle part using the coated steel substrate as recited in claim 2.

* * * * *